(12) United States Patent
Eguchi et al.

(10) Patent No.: US 6,627,997 B1
(45) Date of Patent: Sep. 30, 2003

(54) SEMICONDUCTOR MODULE AND METHOD OF MOUNTING

(75) Inventors: Shuji Eguchi, Tokai-mura (JP); Akira Nagai, Hitachi (JP); Haruo Akahoshi, Hitachi (JP); Takumi Ueno, Mito (JP); Toshiya Satoh, Kanasagou-machi (JP); Masahiko Ogino, Hitachi (JP); Asao Nishimura, Kokubunji (JP); Ichiro Anjo, Koganei (JP); Hideki Tanaka, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/463,431

(22) PCT Filed: Mar. 26, 1999

(86) PCT No.: PCT/JP99/01558

§ 371 (c)(1),
(2), (4) Date: Jan. 27, 2000

(87) PCT Pub. No.: WO00/59036

PCT Pub. Date: Oct. 5, 2000

(51) Int. Cl.[7] .......................... H01L 23/48; H01L 23/34
(52) U.S. Cl. ...................... 257/777; 257/723; 257/787; 257/713; 257/717
(58) Field of Search ................... 257/778, 685, 257/686, 723, 777, 713, 717, 783, 784, 786, 787, 793; 438/108, 118

(56) References Cited

U.S. PATENT DOCUMENTS

| | | | |
|---|---|---|---|
| 5,585,668 A | * 12/1996 | Burns | 257/676 |
| 5,872,700 A | * 2/1999 | Collander | 361/760 |
| 5,880,403 A | * 3/1999 | Czjkowski et al. | 174/35 R |
| 5,907,477 A | * 5/1999 | Tuttle et al. | 361/760 |
| 5,969,426 A | * 10/1999 | Baba et al. | 257/778 |
| 5,976,912 A | * 11/1999 | Fukutomi et al. | 438/110 |
| 6,087,202 A | * 7/2000 | Exposito et al. | 438/124 |
| 6,236,568 B1 | * 5/2001 | Lai et al. | 361/704 |
| 6,284,569 B1 | * 9/2001 | Sheppard et al. | 438/110 |
| 6,326,240 B1 | * 12/2001 | Liaw | 438/113 |
| 6,326,544 B1 | * 12/2001 | Lake | 174/52.2 |
| 6,326,696 B1 | * 12/2001 | Horton et al. | 257/777 |

* cited by examiner

*Primary Examiner*—Jasmine J B Clark
(74) *Attorney, Agent, or Firm*—Antonelli, Terry, Stout & Kraus, LLP

(57) ABSTRACT

In a multi-chip module, a plurality of semiconductor chips are mounted on a single wiring board. Upper surfaces of the semiconductor chips are covered with a single heat spread plate, and the whole space around the semiconductor chips, sandwiched between the wiring board and the heat spread plate, is filled with resin. The semiconductor chips are interconnected through the resin so that any stress exerted on any chips is dispersed. This diminishes the occurrence of cracks caused by stress concentration. Since the semiconductor chips and the heat spread plate are bonded together with resin, even if there are variations in size of the chips, both can be bonded easily. Further, the bonding of all the chips and the heat spread plate can be done in a single process.

8 Claims, 10 Drawing Sheets

F I G. 4A
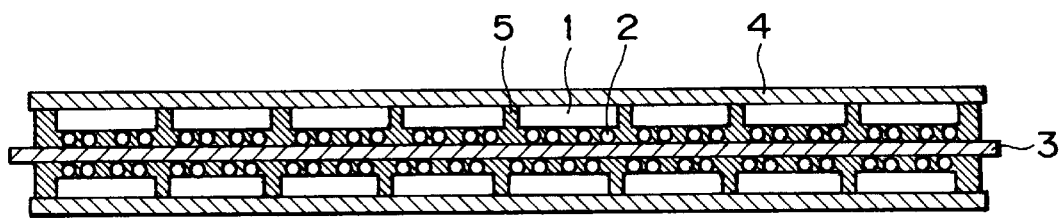
F I G. 4B
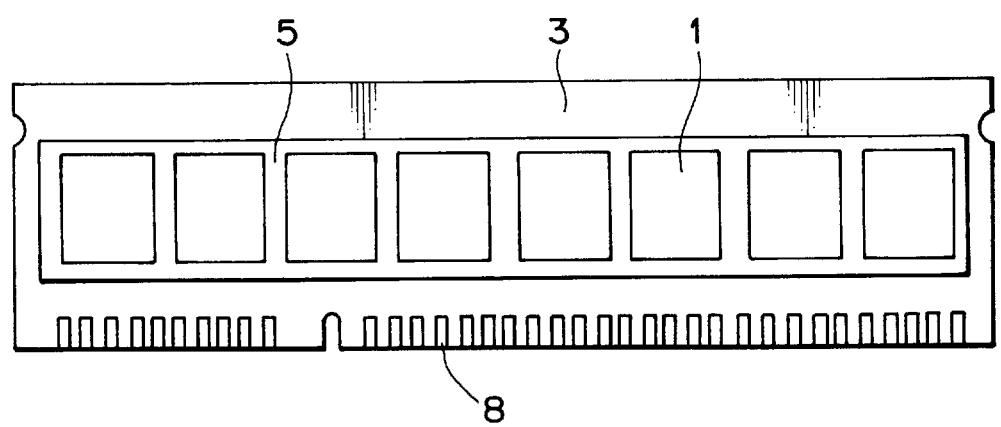

SEMICONDUCTOR MODULE AND METHOD OF MOUNTING

TECHNICAL FIELD

The present invention relates to a semiconductor module in which bare or packaged semiconductor chips are mounted on a wiring board, a heat spread plate is disposed above the semiconductor chips, and resin is filled around the semiconductor chips so that they are sandwiched between the wiring board and the heat spread plate, as well as a mounting method for the semiconductor module. Particularly, the invention is concerned with a multi-chip module with a plurality of semiconductor chips mounted on a single wiring board, as well as a mounting method for the multi-chip module.

BACKGROUND OF THE INVENTION

Semiconductor modules are used as high-speed or highly integrated memories in electronic devices such as personal computers, servers, and large-sized computers. These electronic devices now show a tendency toward reduction of size and thickness and are becoming higher in speed and integration degree. With such a tendency, semiconductor modules are also now required to attain high-density mounting, narrow pitch/multi-pin connection, low noise, and low heat resistance.

Under such circumstances, attempts are being made to enhance the mounting density by mounting on a wiring board a plurality of bare chips or chips size (or chip-scale) packages (hereinafter referred to as CSP) each almost equal in size to a chip. Attempts are also being made to attain a low heat resistance by bonding a heat spread plate to the backs of chips after mounting of plural bare chips or CSPs onto a wiring board.

As an example, in U.S. Pat. No. 5,724,729 there is disclosed a multichip module having a structure wherein a plurality of semiconductor chips are mounted on a single wiring board, and a heat spread cap is bonded to the backs of the semiconductor chips with use of a thermally conductive adhesive.

In Japanese Patent Laid-open No. Sho 63-29563 there is disclosed a semiconductor device having a structure wherein a flip chip is face down-bonded to a mullite substrate through bump electrodes, a silicon carbide substrate superior in thermal conductivity is bonded onto the flip chip with use of solder, and an epoxy resin is filled between the mullite substrate and the silicon carbide substrate. There is also described therein a multi-chip module having a structure wherein a plurality of such semiconductor devices as just referred to above are mounted on a single substrate, a heat spread plate is disposed so as to cover the plural semiconductor devices from above, and the heat spread plate and the semiconductor devices are connected together using a comb teeth-like heat transfer part.

According to our study, however, the above conventional techniques involve the following problems.

First, in the multi-chip module described in U.S. Pat. No. 5,724,729, the stress exerted on a chip is not dispersed because there exists a gap between adjacent chips. Consequently, when a stress is applied to a certain chip, the bonded end face between the stressed chip and the heat spread cap is apt to be cracked. Moreover, since an underfill resin is not filled around the bump electrodes connecting the chips to the wiring board, the bump electrodes are apt to be oxidized, besides, heat generated in each chip is difficult to be transmitted to the wiring board.

In the multi-chip module disclosed in Japanese Patent Laid-open No. Sho 63-29563, plural semiconductor devices are fixed to the heat spread plate mechanically through the heat transfer part, so if there are variations in size of the semiconductor devices, the heat spread plate will tilt, making it difficult to fix the semiconductor devices to the heat spread plate. In the module disclosed in Japanese Patent Laid-open No. Sho 63-29563, since the heat transfer part is in the shape of comb teeth, it is difficult for the heat spread plate to tilt even if there are slight variations in size of the semiconductor devices, but the comb teeth shape makes the structure of the multi-chip module complicated. Although resin is molded sideways of each semiconductor device, there is a resin-to-resin gap, so that water is apt to get into the gap or moisture condensation is apt to occur, with a consequent tendency toward material deterioration of the resin and insulation degradation.

In a multi-chip module, it is well known, as described in Japanese Patent Laid-open No. Hei 7-86492, that an underfill resin is filled between the semiconductor chips and a wiring board. However, the provision of a heat spread plate is not described in Japanese Patent Laid-open No. Hei 7-86492, giving no hint for solving the foregoing problems.

It is an object of the present invention to provide a semiconductor module having a structure wherein a plurality of bare or packaged semiconductor chips are mounted on a single wiring board and are covered with a single heat spread plate, the semiconductor chips and the heat spread plate being bonded together so as to permit thermal conduction without using any other heat transfer part, with a stress exerted on each of the semiconductor chips being dispersed, as well as a mounting method for the semiconductor module.

It is another object of the present invention to provide a semiconductor module having a structure wherein a plurality of semiconductor chips are connected to a single wiring board with use of metal bumps, a single heat spread plate is disposed on the backs of the semiconductor chips, a gap between the semiconductor chips and the wiring board is filled with an underfill resin, and the semiconductor chips and the heat spread plate are bonded together without using any other heat transfer part, allowing a stress exerted on each chip to be dispersed, as well as a mounting method for the semiconductor module.

SUMMARY OF THE INVENTION

The present invention, in a first aspect thereof, resides in a semiconductor module having a structure wherein a plurality of bare or packaged semiconductor chips are mounted on a single wiring board and a single heat spread plate is disposed on the plural semiconductor chips, characterized in that resin is filled around the plural semiconductor chips thus sandwiched between the wiring board and the heat spread plate and that adjacent semiconductor chips are connected together through the resin.

As methods for mounting a bare or packaged semiconductor chip onto a wiring board there are a method wherein the semiconductor chip is mounted while a circuit-formed side of the chip faces down and is opposed to the wiring board, and a method wherein the circuit-formed side of the chip faces up and a circuit-free side of the chip is opposed to the wiring board. In a semiconductor module of a face-down bonding type wherein a semiconductor chip is connected to a wiring board while a circuit-formed side of the semiconductor chip faces down, pads formed on the circuit-formed side of the chip and pads formed on the wiring board are connected together through metal bumps. On the other hand, in a semiconductor module of a face-up bonding type wherein a semiconductor chip is mounted on a wiring board while a circuit-formed side of the chip faces up, a circuit-free side of the semiconductor chip is bonded to the wiring board using an adhesive, and pads formed on the circuit-formed side of the semiconductor.chip and pads formed on the wiring board are bonded together with metal wires. The term "pads" as used herein indicate input-output terminals, which are sometimes called electrodes, electrode terminals, or simply terminals.

The present invention, in a second aspect thereof, resides in a semiconductor module having a structure wherein a plurality of either bare semiconductor chips or packaged semiconductor chips are connected to a single wiring board electrically through metal bumps while circuit-formed sides of the chips face down, and a single heat spread plate is disposed above circuit-free sides of the chips, characterized in that a resin is filled between the wiring board and the semiconductor chips, also between the semiconductor chips and the heat spread plate, and further between adjacent semiconductor chips, so that the semiconductor chips and the heat spread plate are bonded together with the resin, and the semiconductor chips are interconnected through the resin.

The present invention, in a third aspect thereof, resides in a semiconductor module having a structure wherein circuit-free sides of a plurality of bare or packaged semiconductor chips are bonded to a single wiring board, a single heat spread plate is disposed on circuit-formed sides of the semiconductor chips, and pads formed on the circuit-formed sides and pads formed on the wiring board are bonded together with metal wires, characterized in that resin is filled between the semiconductor chips and the heat spread plate and also between the plural semiconductor chips, so that the semiconductor chips and the heat spread plates are bonded together with the resin, and the semiconductor chips are interconnected through the resin.

In fabricating the semiconductor module according to the present invention, the semiconductor chips and the heat spread plate may be bonded together using a thermally conductive adhesive. In the semiconductor module of the type wherein semiconductor chips are metal wire-bonded to a wiring board while their circuit-formed sides face up, a spacer may be disposed between the heat spread plate and the semiconductor chips or between the heat spread plate and the wiring board to prevent metal wires from being crushed by the heat spread plate.

The present invention, in a further aspect thereof, resides in a semiconductor module having a structure wherein a plurality of bare or packaged semiconductor chips are mounted on a single wiring board and a single heat spread plate is disposed on upper surfaces of the plural semiconductor chips, characterized in that an adhesive layer is present between the semiconductor chips and the heat spread plate, that resin is filled around the semiconductor chips sandwiched between the wiring board and the heat spread plate, and that the semiconductor chips are interconnected through the resin.

The present invention, in a still further aspect thereof, resides in a semiconductor module having a structure wherein a plurality of bare or packaged semiconductor chips are mounted on a wiring board while circuit-formed sides thereof face up the semiconductor chips and the wiring board are metal wire-bonded to each other, and a single heat spread plate is disposed on the circuit-formed sides of the plural semiconductor chips, characterized in that a metal wire protecting spacer is disposed between the plural semiconductor chips and the heat spread plate, that resin is filled around the semiconductor chips sandwiched between the heat spread plate and the wiring board, and that the semiconductor chips are interconnected through the resin.

The present invention, in a still further aspect thereof, resides in a semiconductor module having a structure wherein a plurality of bare or packaged semiconductor chips are mounted on a wiring board while circuit-formed sides thereof face up, the semiconductor chips and the wiring board are metal wire-bonded to each other, and a single heat spread plate is disposed on the circuit-formed sides of the plural semiconductor chips, characterized in that a metal wire protecting spacer is disposed between the wiring board and the heat spread plate, that resin is filled around the semiconductor chips sandwiched between the heat spread plate and the wiring board, and that the semiconductor chips are interconnected through the resin.

The semiconductor module according to the present invention is obtained by mounting a plurality of semiconductor chips on a wiring board, disposing a heat spread plate, and pouring resin between the wiring board and the heat spread plate. As a resin pouring method there may be adopted a method wherein resin lumps or pellets are put respectively on upper surfaces of semiconductor chips a heat spread plate is then put thereon, then pressing plates are disposed outside both the wiring board and the heat spread plate and pressing is performed under heating, allowing the resin to melt or soften and flow and thereby allowing it to be filled around the semiconductor chips. There also may be adopted a method wherein a wiring board a heat spread plate and semiconductor chips are placed in a mold and a resin is poured into the mold by a transfer press molding. There also may be adopted a method wherein resin lumps or pellets are placed between semiconductor chips mounted on a wiring board and a heat spread plate, which are then placed together into an autoclave, followed by heating to melt or soften and flow the resin, allowing the resin to be filled around the semiconductor chips.

The present invention in still further aspects will become more apparent from working examples thereof to be described later.

The semiconductor chips used in the present invention are bare or packaged semiconductor chips. Bare chips are each formed with a circuit on one side thereof and are each provided with input-output terminals, designated pads, terminals, electrodes, or electrode terminals. In many cases, the input-output terminals are formed on a circuit-formed side of each semiconductor chip.

As an example of a packaged semiconductor chip there is mentioned CSP. An example of CSP is described in Japanese Patent Laid-open No. Hei 9-321084.

According to the CSP described therein, a wiring tape is disposed through a stress buffer layer on a circuit-formed side of a chip and is electrically connected to pads on the chip which connected portions are sealed using a resin, with metal bumps being formed on the wiring tape. The CSP of this structure is suitable for use in the present invention. Examples of such packaged semiconductor chips include SOJ (Small Outline J-lead package). TSOP (Thin Small Outline Package), and TCP (Tape Carrier Package), in addition to CSP, all of which are employable in the present invention.

In the present specification, the term "semiconductor chip" cover both bare chips and packaged semiconductor chips unless otherwise mentioned. Further, the term mounting" as referred to herein refers, in a narrow sense, to a technique of mounting a semiconductor chip on a wiring board and connecting it to the board electrically, while in a broad sense, it refers to the technique plus a subsequent heat spread plate bonding technique or resin pouring technique. The "metal bump" as referred to herein corresponds to the bump electrode referred to in the prior art.

In the semiconductor module according to the present invention, since semiconductor chips are interconnected through a resin, even if a stress is exerted on any of the chips, it is dispersed in all directions through the resin. Thus, there is no fear of the chips and the heat spread plate being cracked. Besides, since the bonding between the semiconductor chips and the heat spread plate is produced by the resin, the heat spread plate is not likely to tilt, unlike the case where a heat transfer part is used. Further, in the semiconductor module having a structure wherein metal bumps are formed between semiconductor chips and a wiring board, since resin is filled between the chips and the wiring board, the thermal conductivity from the chips to the wiring board is improved and the metal bumps are difficult to be oxidized. The resin also serves to protect the chips and prevent bending of the module.

A semiconductor device having a structure in which a semiconductor chip is sandwiched between a substrate and a heat spread plate and a resin is molded around the chip, is disclosed in Japanese Patent Laid-open Nos. Hei 7-11278 and Hei 9-17827. But, the assembly of a multi-chip module is not described therein.

Since the space around each semiconductor chip sandwiched between the wiring board and the heat spread plate, which is filled with the resin, is narrow, it is desirable that the resin be superior not only in its fluidity but also in thermal conductivity because the resin also serves to let the heat of the semiconductor chip escape to the wiring board and the heat spread plate. More specifically, it is preferable for the resin to have a thermal conductivity in the range of 0.5 to 3.5 W/m° C. If the thermal conductivity of the resin is less than 0.5 W/m° C., a satisfactory heat dispersion effect will not be obtained, while if it exceeds 3.5 W/m° C., then if the resin is of the type which requires the incorporation of a thermally conductive filler therein to impart a thermal conductivity to the resin, the amount of the filler becomes too large, with the result that the fluidity of the resin is deteriorated and thereby voids easily occur or an unsatisfactory fill results.

A thermosetting resin is one of the preferred resins. If a thermosetting resin is used, the resin viscosity will lower greatly at the time of heating for molding, so that the resin can be filled in a void-free state and the delamination of the resin becomes difficult to occur. As to a thermoplastic resin, a lowering of viscosity at the time of fill of the resin and the heat resistance of a resin composition obtained after cooling are not compatible with each other, so in the case of using a thermoplastic resin, it is desirable for the resin to be mixed with a thermosetting resin component. By incorporating a thermosetting resin into the thermoplastic resin, a three-dimensional network structure is introduced into the thermoplastic resin by heat-curing after molding and there is obtained a resin having a structure called an interpenetrating polymer network. The resin having such a network structure is improved in heat resistance while making the most of the advantage of the thermoplastic resin, namely, a short molding time.

As thermosetting resins there may be used, for example, acid anhydride curing type, phenol curing type, imidazole curing type, or amine curing type exposy resins. There also may be used polyfunctional acrylate and methacrylate resins, cyanate ester resins, and addition type maleimide or bismaleimide resins.

As thermoplastic resins there may be used polyimide or polyamide resins for example.

As to a thermosetting resin to be incorporated into the thermoplastic resin used, it is desirable to use a thermosetting resin having a linear expansion coefficient of 10 to 60 ppm/° C., a glass transition temperature of not lower than 80° C., and an elastic modulus at room temperature in the range of 500 MPa to 25 GPa, as characteristics of a heat-cured product obtained from the thermosetting resin. If the thermosetting resin is less than 10 ppm/° C. in its linear expansion coefficient, lower than 80° C. in its glass transition temperature, and less than 500 MPa in its elastic modulus at room temperature, it becomes easier for the resin to come off from the wiring board and the heat spread plate at the bonded portions due to a shrinking stress of the resin. If the linear expansion coefficient of the thermosetting resin exceeds 60 ppm/° C. and the elastic modulus at room temperature thereof exceeds 25 GPa, there is an increase in the stress which is induced by a difference in thermal expansion coefficient between the semiconductor chip and the resin or between the wiring board and the resin, so that cracks and delamination are apt to occur in the interfaces of chips, metal bumps, and wiring board.

A thermoplastic polyimide resin with an epoxy resin, a maleimide resin or a bismaleimide resin as a thermosetting resin incorporated therein is well balanced in both adherence and hygroscopicity and is therefore suitable for use in the present invention.

From the standpoint of improving the adhesive properties and lowering the stress, it is desirable to incorporate a toughening agent into the resin used, such as silicone rubber, acryl rubber, or nitrile-butadiene rubber. Further, an inorganic filler may be incorporated in the resin for adjusting the linear expansion coefficient or for enhancing the thermal conductivity. As an inorganic filler it is desirable to use a spherical filler having a maximum particle size of not larger than 50 $\mu$m and an average particle diameter in the range of 0.5 to $\mu$m. If the maximum particle diameter of the inorganic filler used exceeds 50 $\mu$m, the resin fill property into a narrow space is deteriorated and voids are apt to occur. If an average particle diameter of the inorganic filler used is smaller than 0.5 $\mu$m, unfilling of the resin is apt to occur because the viscosity of the resin composition concerned increases abruptly. An extremely fine filler is apt to agglomerate and is inferior in dispersibility. Also, when the average particle diameter of the inorganic filler used exceeds 10 $\mu$m, unfilling of the resin is apt to occur. For attaining a low thermal expansion coefficient of the resin it is desirable to use fused silica, synthetic silica, talc, or calcium carbonate as an inorganic filler. Among them, fused silica and synthetic silica are particularly preferred in point of purity, uniform particle shape, and low thermal expansibility. For enhancing the thermal conductivity of the resin it is desirable to use, for example, such a filler as crystalline silica, aluminum nitride, silicon nitride, boron nitride, or alumina. From the standpoint of decreasing the resin viscosity and reducing the damage to chips it is desirable that the above inorganic fillers be used in a spherical shape or a corner-cut-off shape close to a spherical shape.

In the case where the gap between the wiring board and the heat spread plate is to be filled with a thermosetting resin alone, it is desirable to use a thermosetting resin having a linear expansion coefficient of not more than 60 ppm/° C., especially not more than 40 ppm/° C.

As the material for the heat spread plate, there may be used, for example, any of such metals as copper, aluminum, stainless steel, iron, and kovar, as well as such ceramic materials as aluminum nitride, silicon nitride, boron nitride, and alumina, may be used. There also may be used a resin plate containing a filler superior in thermal conductivity such as aluminum nitride, silicon nitride, boron nitride, or alumina, or a resin plate containing a metal as core. A copper plate plated with nickel is also available.

From the standpoint of diminishing warp of the semiconductor module, it is desirable for the heat spread plate, to have a linear expansion coefficient close to that of the wiring board. It is preferable that the difference in linear expansion coefficient between the wiring board and the heat spread plate be not larger than 10 ppm/° C., more preferably 5 ppm/° C. If the difference in linear expansion coefficient between the two exceeds 10 ppm/° C., the module is apt to be warped and the resin is cracked easily in a temperature cycle test. In a temperature cycle condition of −55° C. to 150° C., it is impossible to satisfy 1,000 cycles unless the difference in linear expansion coefficient between the two is 5 ppm/° C. or less.

It is preferable for the heat spread plate used to have a thickness in the range of 10 $\mu$m to 2 mm. A plate thickness thereof smaller than 10 $\mu$m is too thin and makes its handling difficult. If the plate thickness exceeds 2 mm, it is difficult to cut the plate and burrs are apt to occur; besides, the thickness of the semiconductor module itself becomes larger, so such a plate thickness is not suitable for the formation of a thin module. The heat spread plate may be in the shape of a single flat plate or in a cap shape obtained by bending end portions of a plate.

Adhesion of the heat spread plate and the semiconductor chips is used mainly with resin and the heat of each chip is transferred to the heat spread plate through the resin. Therefore, it is preferable that the spacing between the chips and the heat spread plate be as narrow as possible. However, if the spacing is too narrow, voids and delamination of the resin are apt to occur. In view of this point, it is desirable that the spacing of the two be in the range of 10 to 200 $\mu$m.

As the material for the wiring board, there may be used, for example, an organic printed wiring board containing a woven or non-woven fabric formed by glass fibers or organic fibers, a wiring tape such as a polyimide tape, or a ceramic substrate, according to the purpose for which the wiring board is to be used. An organic printed wiring board is suitable for a semiconductor module of a low cost. A flexible polyimide wiring tape is suitable for a semiconductor module which requires the formation of a fine pitch. Further, a ceramic substrate is suitable for a semiconductor module for which high heat resistance and high reliability are required such as a semiconductor module used in an automobile or an industrial electronic device.

BRIEF DESCRIPTION OF THE DRAWINGS

FIG. 4A is a sectional view of a semiconductor module in which semiconductor chips are mounted on both sides of a wiring board with use of metal bumps and FIG. 4B is a top view thereof.

BEST MODE FOR CARRYING OUT THE INVENTION

Semiconductor modules and mounting methods embodying the present invention will be described hereinunder with reference to the accompanying drawings. It is to be understood that the invention is not limited to the following Embodiments.

Embodiment 1

Figure 1A:
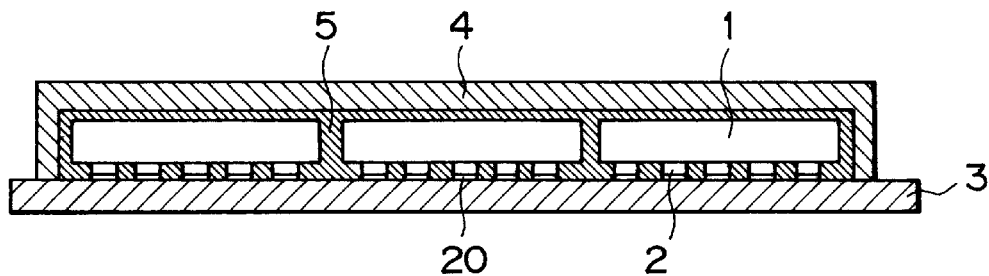
FIGS. 1A and 1B are sectional views of semiconductor modules in which semiconductor chips are mounted on one side of a wiring board with use of metal bumps and FIG. 1C is a top view thereof.
Figure 1B:
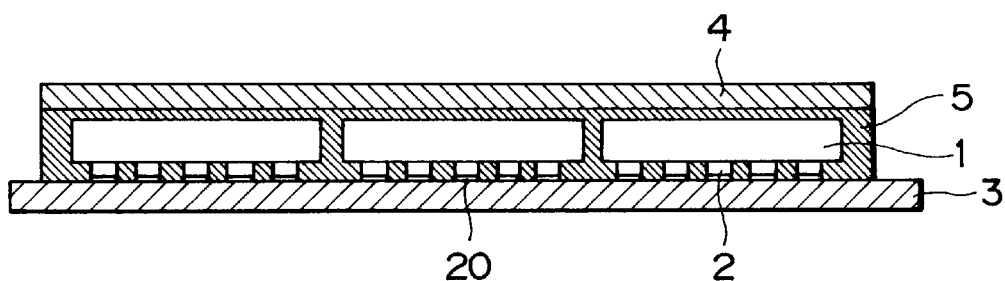
Figure 1C:
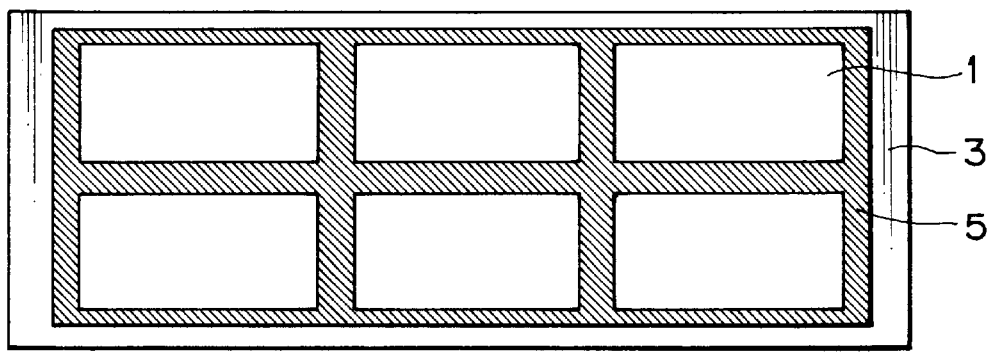

FIGS. 1A and 1B are sectional views of semiconductor modules wherein six semiconductor chips 1 are mounted on one side of a wiring board 3 with use of metal bumps 2, upper surfaces of the semiconductor chips are covered with a heat spread plate 4, and a resin composition 5 is filled between the wiring board and the heat spread plate. FIG. 1C is a top view without the heat spread plate.

In the module shown in FIG. 1A, both ends of the heat spread plate 4 are bent to afford a cap shape, with end faces of the cap being bonded to the wiring board. On the other hand, in the module shown in FIG. 1B, the heat spread plate is formed in a flat plate shape. A comparison of the two shows that the module illustrated in FIG. 1A is superior in point of heat spreading characteristic. The semiconductor chips 1 may be bare chips or may be semiconductor packages such as CSPs. Though not shown in the drawing, one end of the metal bumps 2 is electrically connected to pads of the bare chips and the opposite end thereof is connected electrically to pads 20 of the wiring board 3.

A mounting method for the semiconductor module having the structure shown in FIG. 1B will be described below with reference to FIGS. 5A to 5F.

Figure 5A:
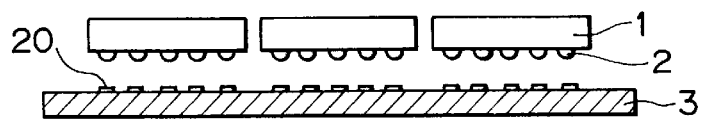
FIGS. 5A to 5F comprise a process diagram showing steps in mounting method for the semiconductor module having the structure shown in FIG. 1 B.

First, as shown in FIG. 5A, semiconductor chips 1 with metal bumps 2 connected thereto and a wiring board 3 are provided. A solder flux is applied to pads 20 on the wiring board 3 to form a solder.

Figure 5B:
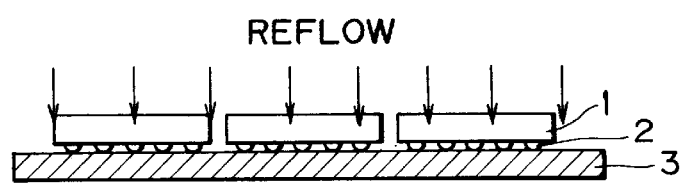
Figure 5C:
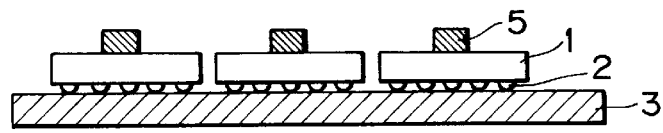
Figure 5D:
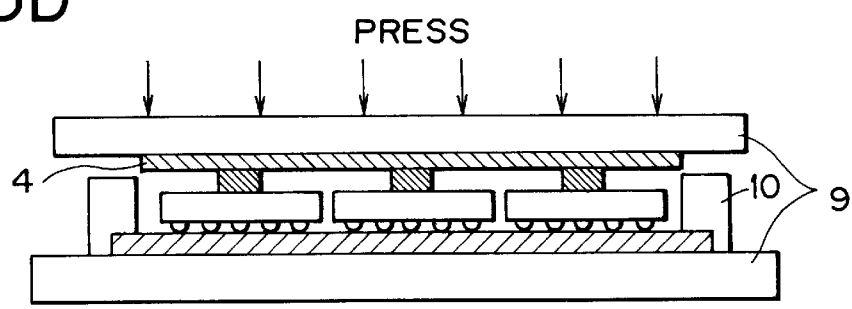
Figure 5E:
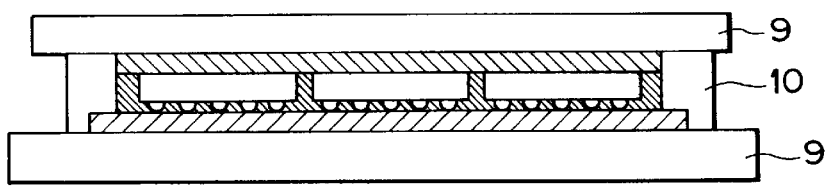
Figure 5F:
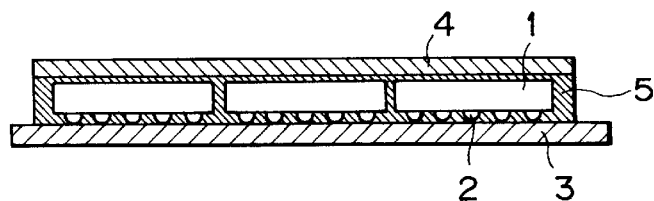

Next, as shown in FIG. 5B, the semiconductor chips 1 are mounted onto the wiring board with the metal bumps 2 side facing down and the pads on the wiring board and the metal bumps 2 are connected together. In FIG. 5B et seq. the illustration of the pads 20 is omitted. Then, as shown in FIG. 5C, tablets of a resin composition 5 are put respectively on the semiconductor chips. Next, as shown in FIG. 5D, a heat spread plate 4 is put on the tablets of the resin composition 5, and the heat spread plate 4 and the wiring board 3 are sandwiched between two pressing plates 9 from the outside. Spacers 10 are disposed on the wiring board-side pressing plate to prevent the resin composition 5 from flowing to the exterior of the pressing plates 9. A shift is made from this state to the state shown in FIG. 5E by means of a compression molding press. After allowing the module to stand for a while, the pressure is relieved and the module is taken out, providing a multi-chip module having the structure shown in FIG. 5F.

As the semiconductor chips, bare chips were used. Copper pads were formed on the wiring board and an eutectic solder of lead and tin was formed on the copper pads. Bonding of the copper pads and the metal bumps 2 was performed by an infrared reflow at 240° C. The diameter of each metal bump 2 is 0.38 mm, the pitch between adjacent metal bumps is 0.8 mm, and a stand-off height of each chip and the wiring board is about 100 μm. The resin composition comprises 20 wt % of an epoxy resin blend consisting of a biphenyl type epoxy resin (100 parts by weight), a phenol novolac resin curing agent (54 parts), a triphenylphosphine curing accelerator (4 parts), an epoxysilane coupling agent (3 parts) and a carbon colorant (1 part) and 80 wt % of a spherical fused silica (maximum particle diameter: 45 μm, average particle diameter: 7 μm). The epoxy resin blend and the spherical fused silica were mixed together using mixing rolls at a temperature of 60° C. to 120° C. The resin composition 5 was used in this kneaded state. The resin composition, after heat-curing, was found to have a linear expansion coefficient of 16 ppm/° C., an elastic modulus of 15 Gpa at room temperature, and a glass transition temperature of 120° C. As the heat spread plate 4 there was used a nickel-plated copper plate having a thickness of 500 μm. The compression molding was carried out by preheating to 100° C. for 10 minutes, followed by an increase of the temperature to 150° C. and application of a pressure of 20 kg/cm$^2$ at that temperature.

After the compression molding, the temperature was held at 150° C. for 1 to 2 hours, allowing post-curing to take place. As a result, the module using an FR4 printed wiring board (linear expansion coefficient: 14 ppm/° C.) conforming to the ANSI (Americal National Standard Institute) standard, which is usually employed as a wiring board, was found to warp as little as 20 μm. This is because the linear expansion coefficient of 17 ppm/° C. of the copper plate used as the heat spread plate was close to that of the resin.

In this embodiment, since the spacing between the semiconductor chips and the wiring board is filled with resin, the heat of the chips is diffused to the wiring board side in a satisfactory manner. Besides, since the metal bumps 2 are surrounded with resin, the bumps are difficult to be oxidized. Moreover, since the chips are interconnected through the resin, the stress exerted on any of the chips is dispersed. Further, since the bonding of the heat spread plate and the chips is effected using a resin, the heat spread plate can be mounted easily even if there are variations in size of the semiconductor chips. Further, since the same resin is filled in the gap between the wiring board and the heat spread plate by a single filling process, there is no fear that an interface may be formed within the resin, nor is there any fear of interface separation. An additional effect is that all the semiconductor chips can be bonded to the heat spread plate at one time.

Embodiment 2

Figure 2A:
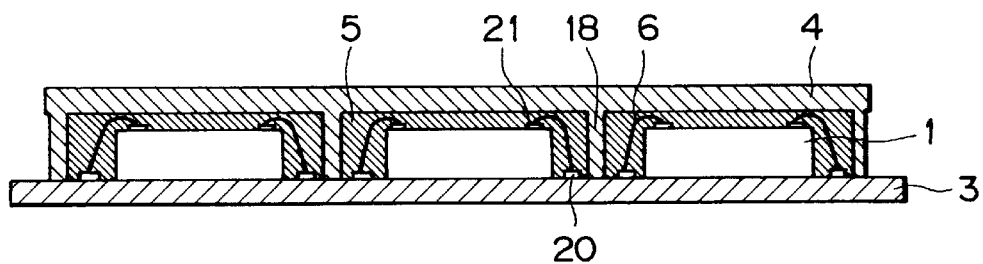
FIG. 2A is a sectional view of a semiconductor module in which semiconductor chips are mounted on one side of a wiring board by metal wire bonding and FIG. 2B is a top view thereof.
Figure 2B:
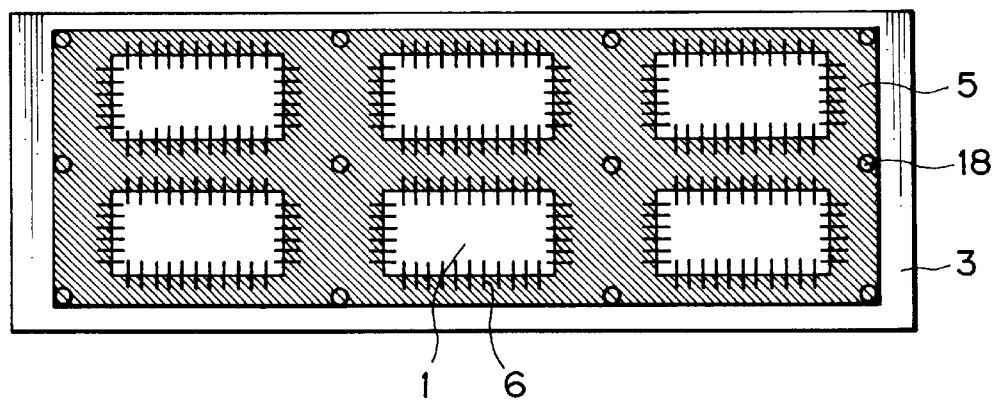

FIG. 2A is a sectional view of a semiconductor module wherein six semiconductor chips 1 are mounted on one side of a wiring board 3 by a metal wire bonding method and FIG. 2B is a top view thereof without a heat spread plate. The six semiconductor chips 1 are sealed by a resin composition 5 together with metal wires 6. A mounting method for this semiconductor module will be described below with reference to FIGS. 6A to 6F.

Figure 6A:
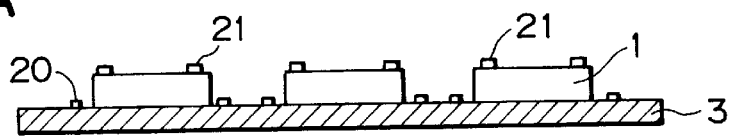
FIGS. 6A to 6F comprise a process diagram showing steps in a mounting method for the semiconductor module having the structure shown in FIG. 2.
Figure 6B:
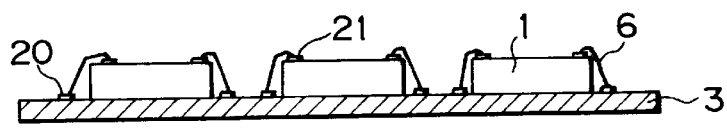
Figure 6C:
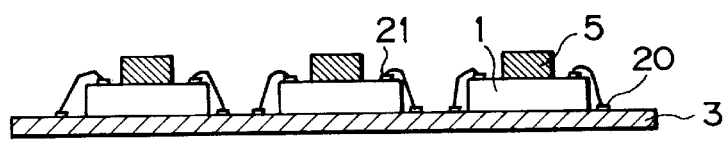
Figure 6D:
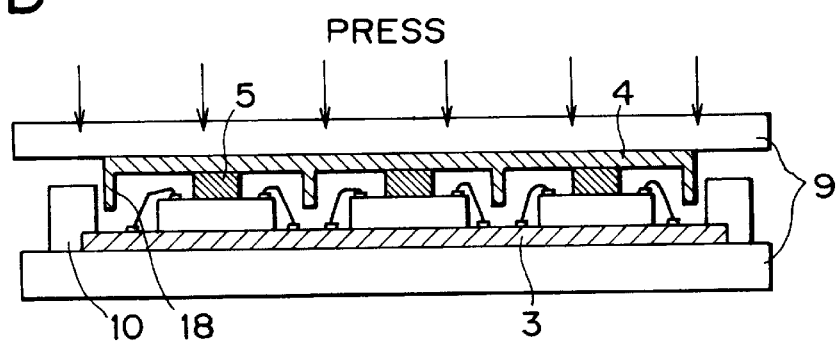
Figure 6E:
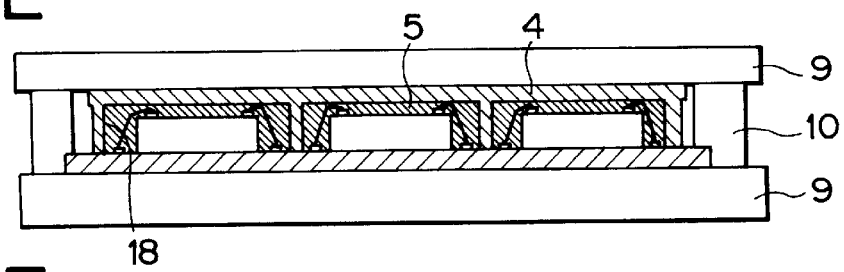
Figure 6F:
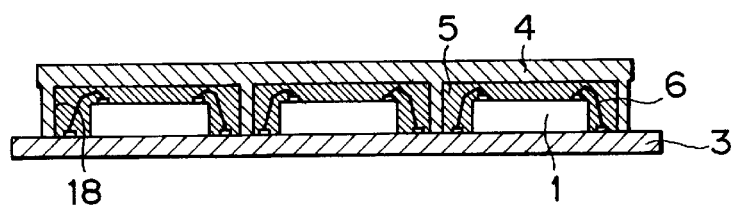

First, semiconductor chips 1 are mounted on a wiring board 3 with use of an insulative adhesive as in FIG. 6A. Preferably, the adhesive is an epoxy resin adhesive having a low elastic modulus which is 1 Gpa or lower at room temperature. Then, pads 21 formed on a circuit-formed side of each semiconductor chip 1 and pads 20 formed on the wiring board 3 are connected together using metal wires 6 as in FIG. 6B. Next, a resin composition 5 is put on each semiconductor chip as in FIG. 6C. Thereafter, as shown in FIG. 6D, a heat spread plate 4 is put on the resin composition 5 and molding is performed using a compression molding press in such a manner that the wiring board and the heat spread plate are pressed from both sides by means of pressing plates 9. In order to prevent the metal wires 6 from being crushed in the compression molding, it is desirable that reinforcing pins 18 be provided on the heat spread plate 4 or spacers 10 be disposed between the upper and lower pressing plates. As seen in FIG. 2B, twelve cylindrical reinforcing pins 18 are attached to the heat spread plate 4, and spacers 10 are also provided. The molding with the compression molding press brings about a state as shown in FIG. 6E. Thereafter, the pressing plates are removed to obtain a module as shown in FIG. 6F.

When a nickel-plated copper plate having a linear expansion coefficient of 17 ppm/° C. was used as the heat spread plate 4, the same materials as that used in Embodiment 1 was used as the resin composition 5, an FR4 printed wiring board (linear expansion coefficient: 14 ppm/° C.) conforming to the ANSI standard was used as the wiring board, and bare chips were used as the semiconductor chips, the semiconductor module obtained was voidless and a warp of the entire module was found to be as small as 50 μm.

Also, in this embodiment, the semiconductor chips and the heat spread plate can be bonded together without using any heat transfer part. Further, since the chips are interconnected through the resin composition 5, a stress exerted on any of the chips is dispersed.

Embodiment 3

Figure 3:
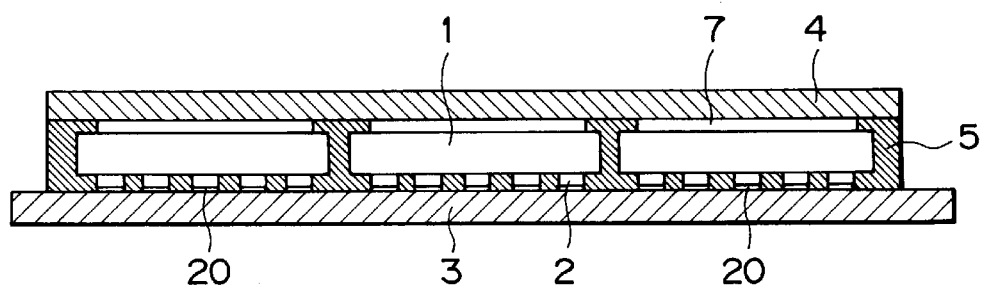
FIG. 3 is a sectional view showing another example of a semiconductor module in which semiconductor chips are mounted on one side of a wiring board with use of metal bumps.

FIG. 3 shows a semiconductor module wherein a plurality of semiconductor chips 1 are mounted on one side of a wiring board 3 with use of metal bumps 2, the semiconductor chips 1 and a heat spread plate 4 are. bonded together using an adhesive 7, and a resin composition 5 is filled around the plural semiconductor chips. A mounting method for the semiconductor module of this structure will be described below with reference to FIGS. 7A to 7H.

Figure 7A:
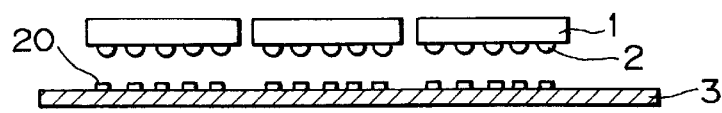
FIGS. 7A to 7H comprise a process diagram showing steps in a mounting method for the semiconductor module having the structure shown in FIG. 3.
Figure 7B:
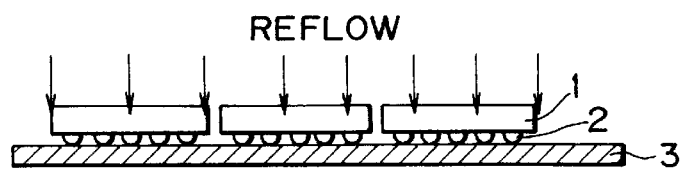
Figure 7C:
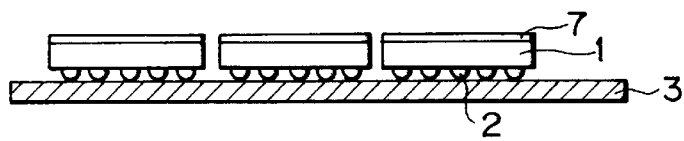
Figure 7D:
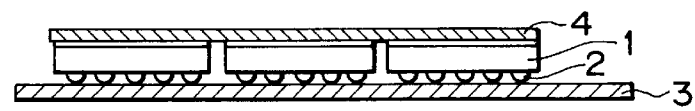
Figure 7E:
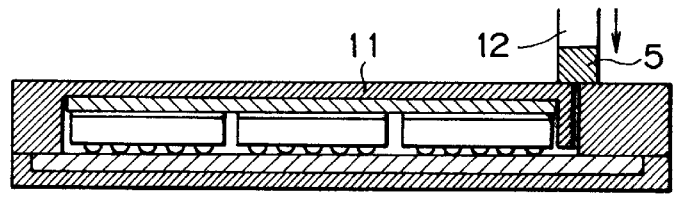
Figure 7F:
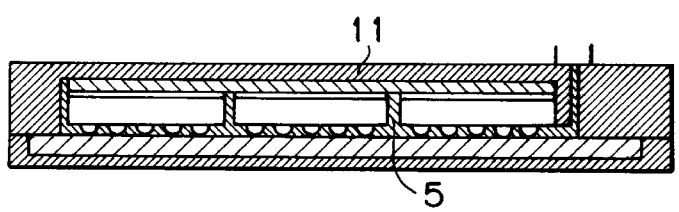
Figure 7G:
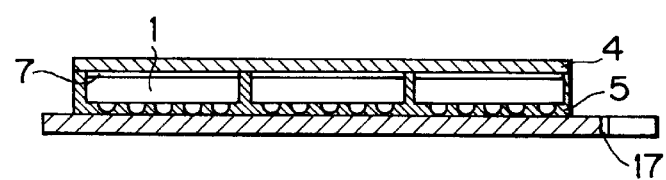
Figure 7H:
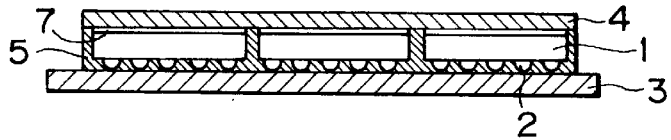

First, as shown in FIG. 7A. semiconductor chips 1 having metal bumps 2 and a wiring board 3 are provided. Next, as shown in FIG. 1B metal bumps 2 are connected to pads 20 formed on the wiring board 3. In FIG. 7B et seq. the illustration of the pads 20 is omitted. Next, an adhesive superior in thermal conductivity is applied onto upper surfaces of the semiconductor chips 1 as in FIG. 7C. Preferably, the adhesive 7 is in the shape of a sheet. For this embodiment, an epoxy resin, a silicone resin, an acrylate or a methacrylate is suitable as the material of the adhesive 7. Then, as shown in FIG. 7D, a heat spread plate 4 is bonded onto the semiconductor chips 1. Next, as shown in FIG. 7E, these components are inserted into a mold 11 and a resin composition 5 is poured into the mold with use of a plunger 12 of a low-pressure transfer press. After the transfer pressing is over, the module is taken out and subjected to post-curing as in FIG. 7G. Then, an extra portion 17 of the wiring board is cut off to obtain a semiconductor module as shown in FIG. 7H.

As the adhesive 7 there was used an epoxy resin adhesive having a thermal conductivity of 1.5 W/m° C. As the chips 1 there were used bare chips, and the bonding of the chips and the heat spread plate was performed by heating them for one hour at a temperature of 150° C. The low-pressure transfer pressing was carried out by holding the module at a temperature of 175° C. and a pressure of 70 kg/cm² for 120 seconds. The resin composition 5 comprises 20 wt % of an epoxy resin blend consisting of a biphenyl type epoxy resin (100 parts by weight), an aralkylphenol resin curing agent (85 parts), an imidazole curing accelerator (2 parts), an epoxysilane coupling agent (3 parts), a carbon colorant (1 part) and 2 parts of a mold release agent consisting of polyethylene and montanic acid ester, 40 wt % of a spherical fused silica (maximum particle diameter: 45 µm, average particle diameter: 7 µm), and 40 wt % of alumina (maximum particle diameter: 50 µm, average particle diameter: 7 µm). The epoxy resin blend, the spherical fused silica and the alumina were kneaded together at a temperature of 60° C. to 120° C. using kneading rolls. The resin composition 5 was used in this kneaded state. The resin composition, after heat-curing thereof, was found to have a glass transition temperature of 125° C., a linear expansion coefficient of 15 ppm/° C., an elastic modulus of 17.5 GPa at room temperature and a thermal conductivity of 1.2 W/m° C. After the transfer pressing, the module was subjected to post-curing at 175° C. for 2 hours. The semiconductor module thus obtained was voidless, and a warp of the entire module was as small as 55 µm in the use of an FR5 printed wiring board (linear expansion coefficient: 13 ppm/° C.). This embodiment is different from the previous embodiments in that the adhesive 7 is disposed between the semiconductor chips and the heat spread plate 4. As to the adhesive, by using an adhesive superior in thermal conductivity to the resin composition 5, it is possible to enhance the heat spreading characteristic to a greater extent than in the previous embodiments. Also, in this embodiment a stress exerted on a chip is dispersed because it is transmitted to the other chips through the resin.

Embodiment 4

FIG. 4A is a sectional view of a semiconductor module wherein semiconductor chips 1 are mounted on both sides of a wiring board 3 with use of metal bumps 2, and FIG. 4B is a top view thereof with the heat spread plate removed. The numeral 8 in FIG. 4 denotes a copper wiring pattern. A mounting method for the semiconductor module of the structure shown in FIGS. 4A and 4B will be described below with reference to FIGS. 8A to 8E.

Figure 8A:
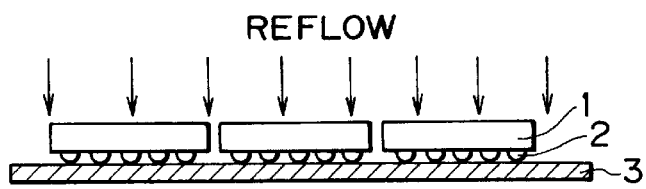
FIGS. 8A to 8E comprise a process diagram showing an example of steps in a mounting method for the semiconductor module having the structure shown in FIG. 4.
Figure 8B:
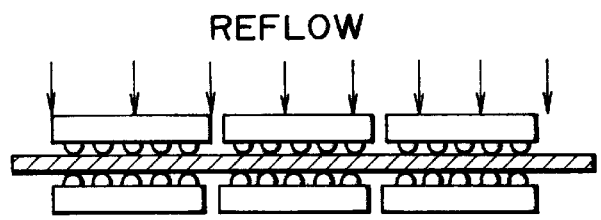
Figure 8C:
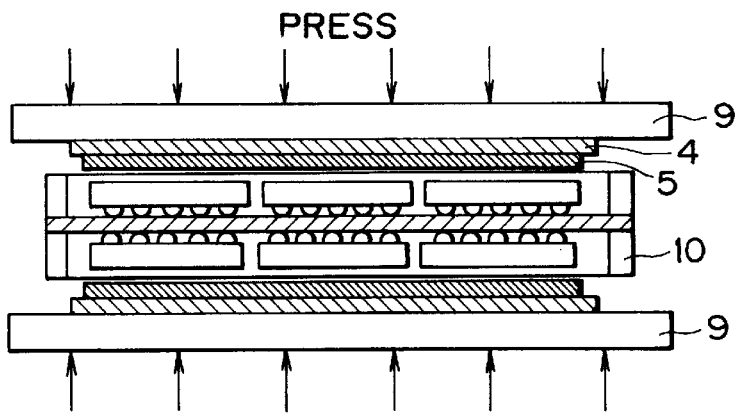
Figure 8D:
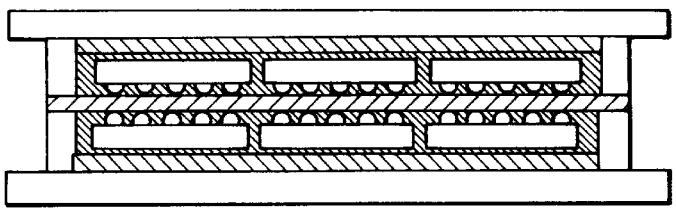
Figure 8E:
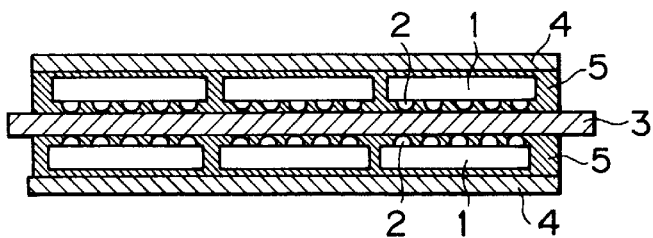

First, semiconductor chips 1 are mounted on one side of a wiring board as in FIG. 8A. Although pads are formed on the wiring board, the illustration thereof is omitted. Although in FIG. 4 eight semiconductor chips are mounted on one side of the wiring board, only three are shown here for simplification. Next, as shown in FIG. 8B the wiring board 3 is turned upside down and a plurality of semiconductor chips 1 are mounted also on the back of the wiring board. Thereafter, as shown in FIG. 8C, heat spread plates 4 with a thin film of a resin composition 5 formed on one side of each of the heat spread plates are put on the semiconductor chips 1 in such a manner that the resin composition 5 faces the semiconductor chips 1. Then, the heat spread plates 4 are pressed from the outside by pressing plates 10. For forming a thin film of the resin composition 5 on each heat spread plate 4, there may be adopted, for example, a laminating method using a hot press or a method in which the resin composition is dissolved in a solvent and screen-printed onto the heat spread plate, after which the solvent is heat-volatilized. In FIG. 8C spacers 10 are mounted on both sides of the wiring board to keep the spacing between the semiconductor chips 1 and the heat spread plate 4 constant. As a result of the compression molding, there is obtained a state as shown in FIG. 8D. Subsequently, as shown in FIG. 8E, the pressing plates are removed and the semiconductor module is taken out. A multi-chip module obtained by using GSPs as the semiconductor chips and by following the mounting method shown in FIGS. 8A to 8E was found to be voidless and suitable for use as a memory module in a personal computer or a server.

The mounting method of this embodiment is also advantageous in that a double-side mounting can be done at one time.

Embodiment 5

FIGS. 9A to 9F comprise a process diagram showing another mounting method for a semiconductor module wherein a plurality of semiconductor chips are mounted on both sides of a wiring board.

Figure 9A:
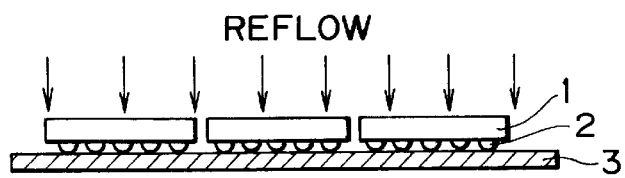
FIGS. 9A to 9F comprise a process diagram showing another example of steps in a mounting method for the semiconductor module having the structure shown in FIG. 4.
Figure 9B:
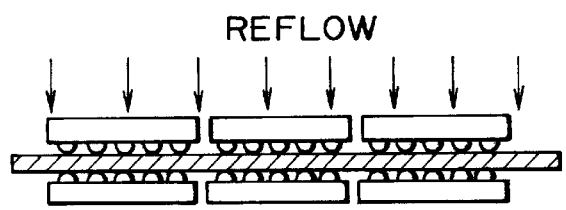
Figure 9C:
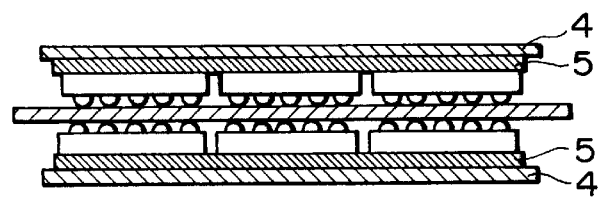
Figure 9D:
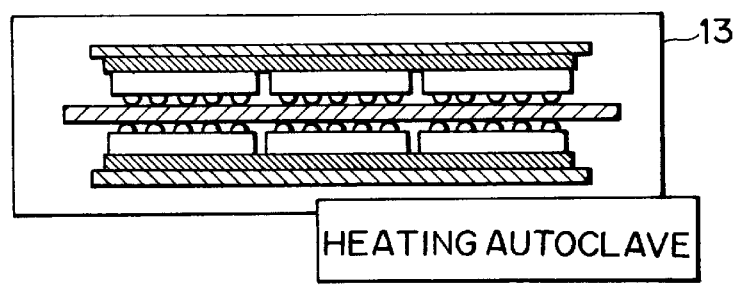
Figure 9E:
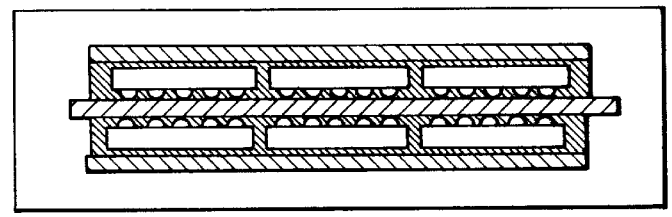
Figure 9F:
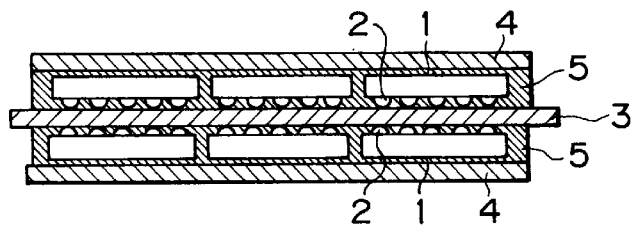

The steps in FIGS. 9A and 9B are the same as in Embodiment 4. Pads formed on a wiring board are omitted in the drawing. In the next step, a thin plate of a resin composition 5 is sandwiched between heat spread plates and the semiconductor chips and the heat spread plate is bonded under pressure temporarily to the chips as shown in FIG. 9C. Then, as shown in FIG. 9D, these components are inserted into a heating autoclave 13, followed by laminating under heating as in FIG. 9E. For example, the laminating step is carried out by a method wherein, after evacuation of the autoclave, the temperature is raised to 100° C., then further raised to 150° C. gradually, and when the temperature has reached 150° C. pressure is applied using nitrogen gas, after which the module is allowed to stand at that temperature for 60 minutes. After subsequent cooling, pressure is relieved and the semiconductor module is taken out, as shown in FIG. 9F.

Since the heating autoclave can apply pressure uniformly to the whole of the module, even if there are variations in height of the semiconductor chips mounted on the wiring board, it is possible to effect bonding of the chips and the heat spread plate easily without damage to the chips.

Embodiment 6

FIGS. 10A to 10G comprise a process diagram showing another embodiment of a mounting method for the semiconductor module wherein semiconductor chips 1 are mounted on one side of a wiring board 3 by metal wire bonding.

Figure 10A:
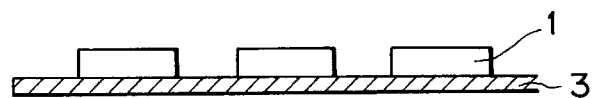
FIGS. 10A to 10G comprise a process diagram showing another example of steps in a mounting method for the semiconductor module in which semiconductor chips are mounted on one side of a wiring board by metal wire bonding.
Figure 10B:
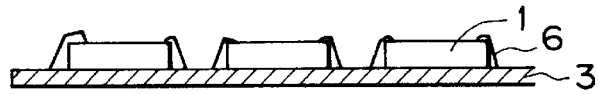
Figure 10C:
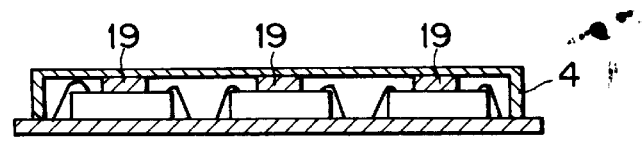
Figures 1, 10D:
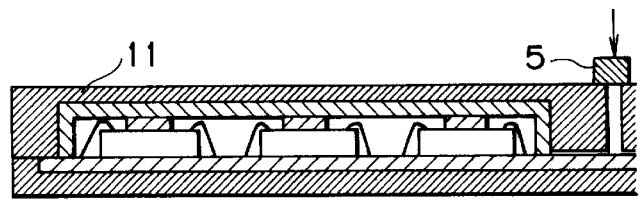
Figures 2, 10D:
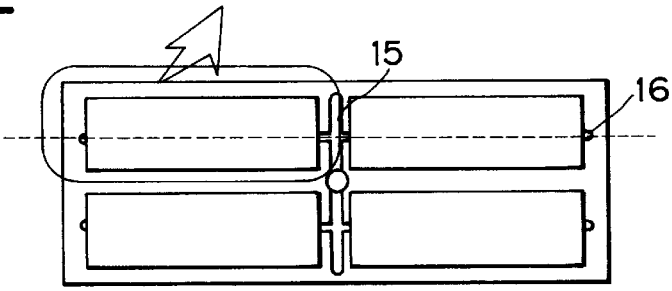
Figure 10E:
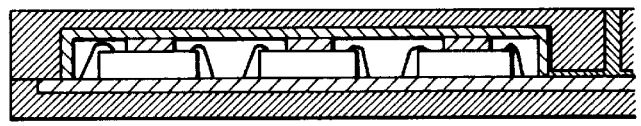
Figure 10F:
Figure 10G:
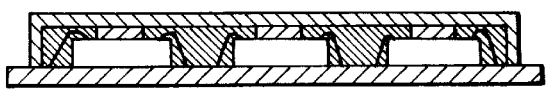

The steps in FIGS. 10A and 10B are the same as in Embodiment 2. Pads formed on the wiring board and the semiconductor chips are omitted in the drawing. In the next step, cylindrical pins 19 are placed between a cap-shaped heat spread plate 4 and the semiconductor chips 1 and are bonded under pressure temporarily to the heat spread plate and the chips. Further, end portions of the heat spread plate 4 are bonded to the wiring board 3. In this way, there is obtained a state as shown in FIG. 10C. Metal or resin may be used as the material of the pins 19. It is desirable to use a material superior in thermal conductivity because the pins 19 also function to let the heat generated in the semiconductor chips escape to the heat spread plate. The pins 19 can be bonded under pressure temporarily to the heat spread plate by screen printing or by using a dispenser. Thereafter, as shown in FIG. 10D-1, the components thus assembled are inserted into a mold 11 and a resin composition 5 is poured into the mold 11 with use of a low-pressure transfer press. If molds are arranged as in FIG. 10D-2, four sets of semiconductor modules can be formed simultaneously by molding. In transfer pressing, as shown in FIG. 10D-2, the resin composition 5 passes through a mold runner 15 and is filled into the modules. Gas produced during the molding and extra resin are discharged through air vents 16. FIG. 10D-1 illustrates one of the four cavity portions shown in FIG. 10D-2. As a result of the transfer molding, there is obtained a state as shown in FIG. 10E. In this state, each module is taken out and subjected to post-curing, whereby the state of FIG. 10F is obtained. Lastly an extra portion 17 of the wiring board is cut off to obtain a semiconductor module having the structure shown in FIG. 10G.

This embodiment is advantageous in that the resin can be poured at one time for a plurality of multi-chip modules.

Embodiment 7

FIGS. 11A to 11E comprise a process diagram showing another embodiment of a mounting method for the semiconductor module wherein a plurality of semiconductor chips 1 are mounted on both sides of a wiring board 3 with use of metal bumps 2.

Figure 11A:
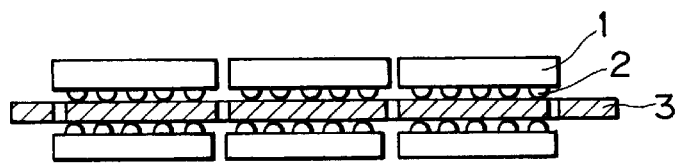
FIGS. 11A to 11E comprise a process diagram showing another example of steps in a mounting method for the semiconductor module in which semiconductor chips are mounted on both sides of a wiring board with use of metal bumps.
Figure 11B:
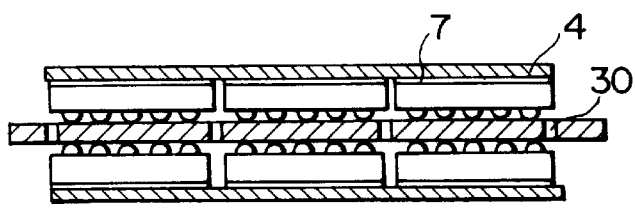
Figure 11C:
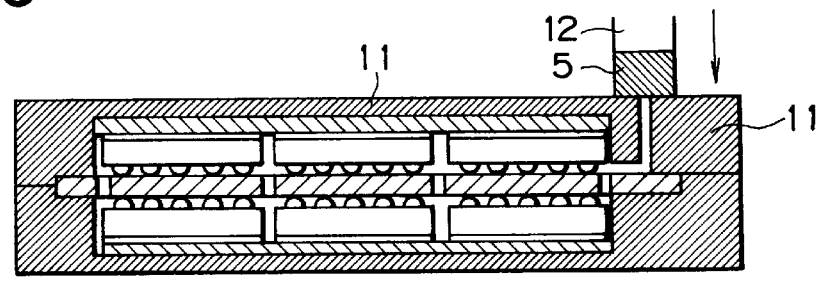
Figure 11D:
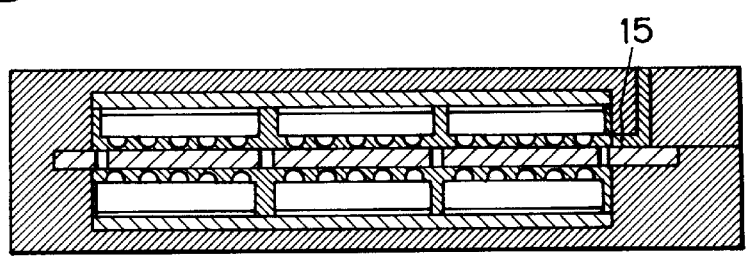
Figure 11E:
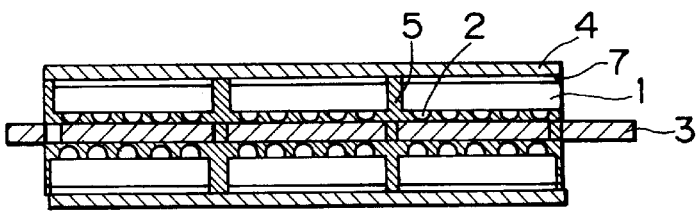

According to this method, semiconductor chips 1 are mounted on both sides of a wiring board 3 in the same manner as in Embodiment 4 to produce the state of FIG. 11A. Next, a thermally conductive adhesive 7 is applied onto upper surfaces of the semiconductor chips 1, then a heat spread plate 4 is put on the chips 1 and bonded to the chips, as shown in FIG. 11B. Thereafter, as shown in FIG. 11C, these components are inserted into a mold 11 and a resin composition 5 is poured into the mold with use of a plunger 12 in a low-pressure transfer press. Since several through holes 30 are formed in the wiring board 3, the resin composition in a melted state passes through the through holes and is filled into all spaces present within the mold. It is preferable that the through holes be formed in a portion other than the wiring pattern portion of the wiring board. The through holes may be replaced by resin composition flowing paths formed in both sides of the wiring board. By a transfer press molding, the interior of the mold is filled with the resin as in FIG. 11D, then the module is taken out and subjected to post-curing to obtain the structure shown in FIG. 11E.

The resin composition 5 used above comprises 20 wt % of an epoxy resin blend consisting of o-cresol-formaldehyde novolac epoxy resin (90 parts by weight), a brominated epoxy resin (10 parts by weight), an alkylphenol novolac resin curing agent (85 parts by weight), an imidazole curing accelerator (2 parts by weight), an epoxysilane coupling agent (3 parts by weight), antimony trioxide (6 parts by weight), a carbon colorant (1 part by weight), and a montanic acid ester mold release agent (1.5 parts by weight), and 80 wt % of a spherical fused silica (maximum particle diameter: 45 μm, average particle diameter: 7 μm). The epoxy resin blend and the spherical fused silica were kneaded at a temperature of 60° C. to 120° C. using kneading rolls. The resin composition was used in this kneaded state. After heat-curing, the resin composition proved to have a glass transition temperature of 150° C., a linear expansion coefficient of 13 ppm/° C., and an elastic modulus of 16.4 GPa at room temperature. An epoxy resin was used as the adhesive 7. The semiconductor module thus obtained was voidless. When bare chips were used, the warp of the entire module was as small as 20 μm in the use of an FR5 printed wiring board (linear expansion coefficient: 13 ppm/° C.).

As will be seen from the above, by forming through holes in the wiring board with semiconductor chips mounted thereon, a double-side mounted semiconductor module can be fabricated easily by use of a transfer press.

Embodiment 8

The following semiconductor module was fabricated in accordance with the mounting method illustrated in FIGS. 11A to 11E.

A ceramic board (thermal expansion coefficient: 3.5 ppm/° C.) formed of aluminum nitride was used as the wiring board 3, an epoxy resin adhesive superior in thermal conductivity (1.5 W/m° C.) was used as the adhesive 7, and an aluminum plate (thermal expansion coefficient: 23 ppm/° C.) was used as the heat spread plate 4. Adhesion of the semiconductor chips (CSPs) and the heat spread plate was effected by heating at 150° C. for 1 hour to cure the epoxy resin adhesive. The transfer press molding was carried out by heating the resin composition at a temperature of 175° C. and a pressure of 70 kg/cm² for 120 seconds.

The semiconductor module obtained was voidless and the warp of the entire module was as small as 15 μm despite a large difference in thermal expansion coefficient between the wiring board and the heat spread plate. This is presumed to be because the semiconductor chips are sandwiched between two upper and lower heat spread plates and are vertically symmetrical. The transfer press molding, in comparison with other molding methods, permits a low-pressure molding and can afford a semiconductor module having a reduced residual strain even in a combination of materials different in thermal expansion coefficient as in this embodiment.

Embodiment 9

A semiconductor module with semiconductor chips (CSPs) mounted on both sides of a wiring board was fabricated in accordance with the method illustrated in FIGS. 9A to 9F. As the resin composition 5, there was used a thermoplastic polyimide resin (melting point: 150° C.). The resin composition 5 was dissolved in a solvent, then applied onto a heat spread plate and dried under heating at a temperature of 10° C. to 150° C., whereby the resin composition 5 was laminated as a thin film onto the heat spread plate. The thickness of the thin resin film was about 1 mm. After curing, the resin composition proved to have a linear expansion coefficient of 50 ppm/° C. and an elastic modulus of 6.5 GPa at room temperature.

The semiconductor module thus obtained was voidless in the interior of the cured resin and there was found no delamination or defect of the resin. The resin penetrated sufficiently between adjacent chips. In comparison with metal wire bonding, the metal bump connection permits the chip height to be made low and is thus suitable for obtaining a thin semiconductor module and is also suitable for a high-density mounting.

Embodiment 10

Using a mixture (weight ratio 1:1) of a thermoplastic polyimide and a thermoplastic polyamide-imide as the resin composition 5 a semiconductor module was fabricated in accordance with the method illustrated in FIGS. 10A to 10G. Bare chips were used as semiconductor chips. In the module obtained, the semiconductor chips sandwiched between a wiring board and a heat spread plate were surrounded with molded resin and there was not found any void. A warp of the entire module was as small as 60 μm in the use of an FR4 printed wiring board (linear expansion coefficient: 14 ppm/° C.).

Embodiment 11

The following semiconductor module was fabricated in accordance with the mounting method illustrated in FIGS. 6A to 6F.

Bonding of the semiconductor chips (CSPs) 1 and a wiring board was performed by heating at a temperature of 180° C. for 1 hour with use of an insulative epoxy resin of a low elasticity (800 MPa at room temperature). Using metal wires 25 μm in diameter, the chips and the wiring board were bonded together at 220° C. by an ultrasonic bonding method. As the resin composition 5 there was used a mixture of a thermoplastic polyimide with an epoxy resin, a phenol novolac curing agent, a triphenylphosphine curing catalyst, and an epoxysilane coupling agent. As the heat spread plate 4 there was used a nickel-plated copper plate (linear expansion coefficient: 17 ppm/° C.).

The semiconductor module obtained was voidless and there was no fear of water invasion or moisture condensation. Further, the warp of the entire module was as small as 70 μm in the use of an FR4 printed wiring board (linear expansion coefficient: 14 ppm/° C.).

According to the present invention, since a stress exerted on a semiconductor chip is dispersed in all directions through the resin, there is no fear of stress concentration on a single chip. In a module of the structure wherein semiconductor chips are bonded to a wiring board with use of metal bumps, the conduction heat from the chips to the wiring board is satisfactory because the gap between the semiconductor chips and the wiring board is filled with resin. Besides, since the bonding of semiconductor chips and a heat spread plate is effected with resin, all the chips can be easily bonded to the heat spread plate even if there are variations in size of the chips.

Thus, the semiconductor module according to the present invention is very suitable as a multi-chip module and is suitable for use as a high-speed and high-integration memory.

What is claimed is:

1. A semiconductor module having a structure wherein a plurality of bare semiconductor chips or packaged semiconductor chips are mounted on a wiring board with circuit-formed sides thereof facing up, said semiconductor chips and said wiring board being metal wire-bonded to each other, and a single heat spread plate is disposed on the circuit-formed sides of said plural semiconductor chips, characterized in that a metal wire protecting spacer is disposed between said semiconductor chips and said heat spread plate, that resin is filled around said semiconductor chips so that they are sandwiched between said heat spread plate and said wiring board, and that said semiconductor chips are interconnected through said resin.

2. A semiconductor module having a structure wherein a plurality of bare semiconductor chips or packaged semiconductor chips are mounted on a wiring board with circuit-formed sides thereof facing up, said semiconductor chips and said wiring board being metal wire-bonded to each other, and a single heat spread plate is disposed on the circuit-formed sides of said plural semiconductor chips, characterized in that a metal wire protecting spacer is disposed between said wiring board and said heat spread plate, that resin is filled around said semiconductor chips so that they are sandwiched between said heat spread plate and said wiring board, and that said semiconductor chips are interconnected through said resin.

3. A semiconductor module according to any one of claims 1 and 2, wherein said resin composition comprises a thermosetting resin.

4. A semiconductor module according to claim 3, wherein an inorganic filler is incorporated in said thermosetting resin.

5. A semiconductor module according to claim 3, wherein said resin composition has a thermal conductivity in the range of 0.5 to 3.15 W/m·° C.

6. A mounting method for a semiconductor module, wherein a plurality of bare semiconductor chips or packaged semiconductor chips are mounted on a single wiring board, a heat spread plate is disposed above said semiconductor chips, and a resin composition is filled in a space formed between said wiring board and said heat spread plate, characterized in that after said semiconductor chips are mounted on said wiring board, said heat spread plate is put on the semiconductor chips, and said resin composition is poured so as to fill the whole of the space formed between said wiring board and said heat spread plate, wherein after said semiconductor chips are mounted on said wiring board, said heat spread plate with said resin composition adhered thereto temporarily is put on the semiconductor chips, and these components are then placed into an autoclave and heated.

7. A mounting method for a semiconductor module wherein a plurality of semiconductor chips are mounted on a single wiring board with circuit-formed sides thereof facing up, pads formed on said circuit-formed sides of the semiconductor chips are metal wire-bonded electrically to pads formed on said wiring board, a single heat spread plate is put on said plural semiconductor chips, and a resin composition is poured into a space formed between said wiring board and said heat spread plate, characterized in that a metal wire protecting spacer is disposed between said semiconductor chips and said heat spread plate at the time of putting the latter onto the former, and thereafter said resin composition is filled into the whole of the space formed between said heat spread plate and said wiring board.

8. A mounting method for a semiconductor module wherein a plurality of semiconductor chips are mounted on a single wiring board with circuit-formed sides thereof facing up, pads formed on said circuit-formed sides of the semiconductor chips and pads formed on said wiring board are metal wire-bonded together electrically, a single heat spread plate is put on said plural semiconductor chips, and a resin composition is poured into a space formed between said wiring board and said heat spread plate, characterized in that a metal wire protecting spacer is disposed between said wiring board and said semiconductor chips and thereafter said resin composition is filled into the whole of the space formed between said heat spread plate and said wiring board.

* * * * *